United States Patent [19]
So et al.

[11] Patent Number: 5,818,757
[45] Date of Patent: Oct. 6, 1998

[54] ANALOG AND MULTI-LEVEL MEMORY WITH REDUCED PROGRAM DISTURB

[75] Inventors: Hock C. So, Redwood City; Sau C. Wong, Hillsborough, both of Calif.

[73] Assignee: Invox Technology, Campbell, Calif.

[21] Appl. No.: 684,788

[22] Filed: Jul. 22, 1996

[51] Int. Cl.[6] .................................................. G11C 16/04
[52] U.S. Cl. ................................. 365/185.18; 365/185.23
[58] Field of Search ......................... 365/185.18, 185.23, 365/185.14, 185.29

[56] References Cited

U.S. PATENT DOCUMENTS

| | | | |
|---|---|---|---|
| 5,267,209 | 11/1993 | Yoshida | 365/185.27 |
| 5,280,446 | 1/1994 | Ma et al. | 365/185.15 |
| 5,555,521 | 9/1996 | Hamada et al. | 365/185.03 |
| 5,604,711 | 2/1997 | Cheung | 365/230.06 |
| 5,619,450 | 4/1997 | Takeguchi | 365/185.23 |

*Primary Examiner*—David C. Nelms
*Assistant Examiner*—Hoai V. Ho
*Attorney, Agent, or Firm*—Skjerven, Morrill, MacPherson, Franklin, & Friel LLP; David T. Millers

[57] ABSTRACT

Applying a bias voltage to unselected word-lines reduces program disturb of the threshold voltages of unselected memory cells during a write to a non-volatile memory. Applying the bias voltage only to memory cells which have already been written with threshold voltages higher than a minimum value and not to erased (or virgin) memory cells allows the bias voltage to be higher without creating currents through unselected memory cells. Data such as a series of samples representing a continuous analog signal can be recorded by writing to sequential addresses to fill one row in an array with data before writing to the next row. Bias flag circuits in a row decoder of the memory indicate which rows are filled with data and therefore which word-lines should have the bias voltage applied during a write.

24 Claims, 5 Drawing Sheets

ANALOG AND MULTI-LEVEL MEMORY WITH REDUCED PROGRAM DISTURB

BACKGROUND OF THE INVENTION

1. Field of the Invention

This invention relates to non-volatile semiconductor memory and particularly to methods and circuits for reducing disturbance of the stored analog or multi-level data when writing other data.

2. Description of Related Art

Non-volatile semiconductor memories such as EPROM, EEPROM, and Flash memories are well known. In such memories, a threshold voltage of a memory cell indicates a data value stored in the memory cell. When writing a data value to a selected memory cell in a conventional non-volatile memory array, programming voltages are applied via a word-line connected to a control gate of the selected cell, a bit-line connected to a drain of the selected cell, and a source-line coupled to a source of the selected cell. The combination of programming voltages changes the threshold voltage of the selected cell typically by causing Fowler-Nordheim (F-N) tunnelling or channel hot electron (CHE) injection which charges (or discharges) a floating gate in the selected memory cell. For example, to induce CHE injection in a selected memory cell containing a typical N-channel floating gate transistor, the word-line voltage for the selected cell is about 12 volts or higher; and the bit-line voltage for the selected cell is typically about 6 volts higher than the source-line voltage (ground) for the selected cell.

The high bit-line and word-line voltages for the selected memory cell can create large voltage differences between the float gate and drain or control gate of unselected memory cells and thereby induce Fowler-Nordheim tunneling that disturbs threshold voltages of unselected memory cells. The voltage difference between the drain and floating gate of an unselected memory cell subjects the memory cell to a disturb referred to herein as drain disturb. The voltage difference between the control gate and the floating gate of an unselected memory cell subjects the memory cell to a disturb referred to herein as gate disturb. Typically, drain disturb is more severe than gate disturb because the magnitude of the electric field in a tunnel layer between the floating gate and the drain is greater than the electric field in an interpoly dielectric layer between the floating gate and the control gate and because the tunneling current I which disturbs a threshold voltage depends exponentially on an electric field E as indicated in equation 1.

Equation 1:

$$I = A \cdot E^2 \cdot e^{-B/E}$$

where A and B are constants.

The disturbance of threshold voltages can accumulate through repeated programming of memory cells in the same column or row and change the data values stored in unselected cells. Depending on the memory, a data value stored in a memory cell may be binary (a bit 0 or 1), multi-level (a value from a set of discrete values), or analog (a value within a continuous range of possible values). For binary memories, the accumulated disturbance of a threshold voltage must be relatively large (on the order of a volt or more) to change the threshold voltage from a state indicating a first binary value to a state indicating the second binary value. For multi-level or analog memories, distinguishable threshold voltage differences for data values can be a few millivolts, and any small disturbances of threshold voltages limit the theoretically achievable threshold voltage resolution. Accordingly, methods and circuits which reduce disturbance of threshold voltages in multi-level and analog non-volatile memories are sought.

One way to reduce threshold voltage disturb is to reduce bit-line and word-line lengths by arranging memory cells in several small arrays rather than one large array. With small arrays, fewer memory cells are on the same row or column so that programming a selected memory cell disturbs fewer unselected memory cells; and the accumulated programming disturb time for each memory cell is less. For example, dividing a large array into four small arrays can divide bit-line and word-line lengths in half and reduce accumulation of threshold voltage disturbance in half. However, four small arrays have about twice the overhead in decoding circuitry as does one large array containing the same number of memory cells. Methods and circuits which reduce disturbance of threshold voltages and have low overhead costs are still needed.

SUMMARY OF THE INVENTION

In accordance with an aspect of the invention, applying a bias voltage to control gates of unselected memory cells containing data values reduces drain disturb. The bias voltage increases the voltage of the floating gate (making the floating gate voltage less negative) through capacitive coupling between the control gate and the floating gate and thus reduces the voltage difference between the floating gate and the drain in memory cells in the same column as a selected memory cell being programmed. The bias voltage is too low to cause a gate disturb in other memory cells but still significantly reduces drain disturb because the F-N tunneling current which causes the drain disturb depends exponentially on an electric field which the bias voltage reduces.

The bias voltage is only applied to word-lines of rows which currently hold data values, and the bias voltage is selected to be less than the minimum threshold voltage of memory cells storing data. This avoids turning on any of the unselected memory cells and avoids increasing current drawn during programming. Erased memory cells may have threshold voltages below the bias voltage, but the bias voltage is not applied to the unselected memory cells which are in the erased state so that those memory cells also remain off during programming. Application of a bias voltage to erased memory cells is not required because a small disturbance of the threshold voltage of an erased cell does not affect data values or operation of the memory.

One embodiment of the invention is a memory where data values are written sequentially to fill one row of memory cells with data before beginning to write to the next row. Memories according to this embodiment are particularly suited for storing a sequence of values representing analog or multi-level samples of a continuous signal such as an audio signal. During writes to the array, the bias voltage is applied to the word-lines associated with the filled rows. A latch, register, flip-flop, or other memory device inside row decoding circuitry can be set to indicate which rows are filled and therefore selected to have the bias voltage applied.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
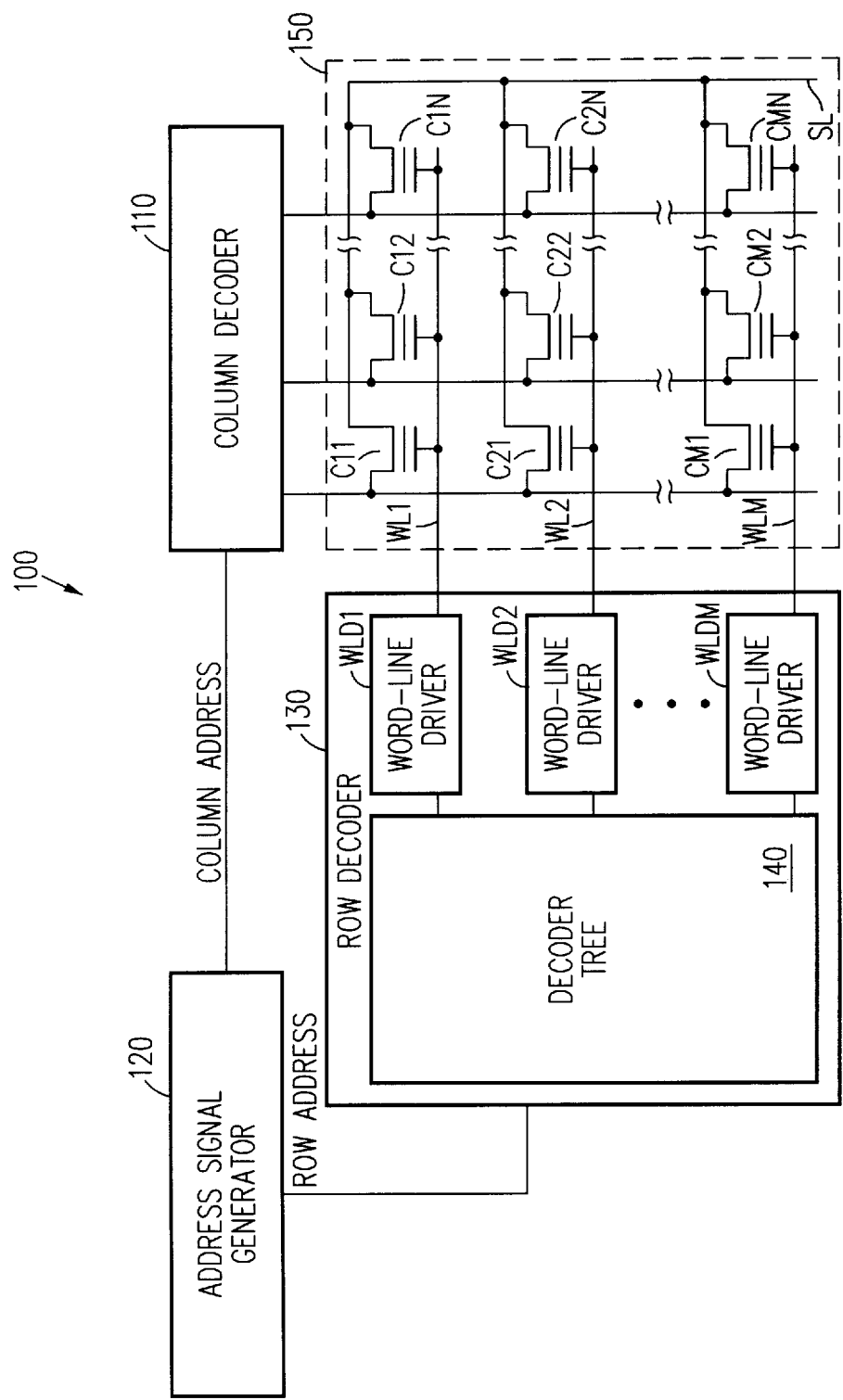
FIG. 1 shows a prior art non-volatile semiconductor memory.

An erasable non-volatile semiconductor memory array such as an EPROM, EEPROM, of Flash memory conventionally includes memory cells organized into rows and columns where each memory cell includes a floating gate transistor or another device which has a threshold voltage that can be set to indicate stored data values. FIG. 1 illustrates a conventional erasable non-volatile memory 100 and memory array 150 which includes M rows and N columns of memory cells C11 to CMN. In array 150, each memory cell C11 to CMN is a single floating gate transistor which has a control gate coupled to one of word-lines WL1 to WLM, a drain coupled to one of bit-lines BL1 to BLN, and a source connected to a common source-line SL.

When writing a data value to a selected one of memory cells C11 to CMN, programming voltages are applied to the word-line and bit-line coupled to the selected memory cell and to the common source-line SL. For example, to write to memory cell C11, source-line SL is grounded; and a row decoder 130 and a column decoder 110 apply programming voltages to word-line WL1 and bit-line BL1. The magnitudes of the programming voltages depend on structure of memory cells C11 to CMN and may depend on the data value being written. If memory array 150 is a typical Flash memory array, programming voltages of about 12 volts on word-line WL1, about 6 volts on bit-line BL1, and 0 volts (ground or Vss) on source-line SL, respectively program memory cell C11 by channel hot electron (CHE) injection. Conventionally, row decoder 130 contains word-line drivers WLD1 to WLDM which apply a programming voltage Vpp to the word-line selected by a decoder tree 140 during a write. The word-line drivers WLD1 to WLDM conventionally ground unselected word-lines. Column decoder 110 applies the programming voltage to the selected bit line and disconnects unselected bit-lines BL2 to BLN.

Some of the programming voltages are applied in different combinations to unselected memory cells as illustrated in Table 1 and may disturb the threshold voltages of unselected memory cells. As indicated by equation 1, a tunneling current I through an insulating layer such as an interpoly or tunnel dielectric layer in a non-volatile memory cell theoretically depends exponentially on an electric field E in the insulating layer.

Equation 1:

$$I = A \cdot E^{2} \cdot e^{-B/E}$$

A and B are constants, typically about $2.5 \times 10^{-6}$ amp/$V^2$ and $2.5 \times 10^8$ V/cm respectively. As indicated by equations 2, the electric field E1 or E2 in the interpoly or tunnel dielectric depends on a voltage drop V1 or V2 across an effective oxide thickness Tipox of the interpoly dielectric or an effective oxide thickness Ttox of the tunnel layer.

Equations 2:

$$E1 = V1/Tipox = (Vg - Vfg)/Tipox$$

$$E2 = V2/Ttox = (Vd - Vfg)/Ttox$$

In a Flash memory cell, Tipox is typically more than 200 Å, and Ttox is typically less than 100 Å. Voltage Vfg is the voltage on the floating gate of the memory cell. Equation 3 indicates the dependence of the floating gate voltage Vfg on: the change δV in threshold voltage from an erased state to a programmed state; the gate, source, and drain voltages Vg, Vs, and Vd of the memory cell; and the floating gate's capacitive couplings Cg, Cs, and Cd to the control gate, the source, and the drain respectively.

Equation 3:

$$Vfg = [Cd \cdot Vd + Cs \cdot Vs + Cg \cdot Vg - Cg \cdot \delta V]/Ct$$

where Ct is the total capacitance (Cd+Cs+Cg). For a typical Flash memory cell, coupling ratios Cg/Ct, Cd/Ct, and Cs/Ct are 0.65, 0.1, and 0.25 respectively.

Table 1 shows exemplary voltages in memory cells C11, C21, C12, and C22 when writing to memory cell C22. In Table 1, voltages Vg, Vs, Vd, δV, Vfg, V1, and V2 are given in volts. Electric fields E1 and E2 are given in Mv/cm and determined assuming Tipox=200 Å and Ttox=100 Å.

TABLE 1

| Cell | Vg | Vs | Vd | δV | Vfg | V1 | V2 | E1 | E2 |
|------|----|----|----|----|-----|----|----|----|----|
| C22 | 12 | 0 | 6 | 1 | | | | | |
| | | | | 4 | | | | | |
| C21 | 12 | 0 | 0 | 1 | 7.2 | 4.9 | −7.2 | 2.4 | −7.2 |
| | | | | 4 | 5.2 | 6.8 | −5.2 | 3.4 | −5.2 |
| C12 | 0 | 0 | 6 | 1 | −.05 | .05 | 6.1 | .03 | 6.1 |
| | | | | 4 | −2 | 2.0 | 8.0 | 1.0 | 8.0 |
| C11 | 0 | 0 | 0 | 1 | −0.7 | 0.7 | 0.7 | 0.3 | 0.7 |
| | | | | 4 | −2.6 | 2.6 | 2.6 | 1.3 | 2.6 |

Voltage V2 is the voltage across the tunnel layer between the drain and the floating gate, and voltage V1 is the voltage across the interpoly dielectric between the control gate and the floating gate. For the voltages shown in Table 1, the electric field E2 in the tunnel layer of memory cell C12 is more than about twice the electric field E1 in the interpoly dielectric of memory cell C21 because the tunnel layer is typically less than half the thickness of the interpoly dielectric. The worst case for drain disturb occurs when memory cell C12 which is in the same column as the selected memory cell has a high threshold voltage. The drain disturb for memory cell C21 which is in the selected row is largest when the threshold voltage of memory cell C21 is low, but the worst case drain disturb of memory cell C21 is still much less than the worst case for memory cell C12. Accordingly, the tunneling current which causes drain disturb in memory cell C12 (and in the other memory cells C32 to CM2 in the selected column) is the primary concern when reducing stress or disturbance of stored data values.

In accordance with an aspect of the invention, drain disturb is reduced by applying a bias voltage Vbias to word-lines corresponding to unselected memory cells to which data was written. The capacitive coupling between the control gate and the floating gate of these unselected cells increases the potential of the floating gate in proportion to the bias voltage and thereby reduces the voltage drop across the tunnel layer between the drain and floating gate of memory cells subject to drain disturb. As shown in Table 2, a bias voltage Vbias of about 1.5 volts lowers voltage drop V2 across the tunnel layer by about 1 volt for a typical Flash memory cell experiencing drain disturb. This reduces the tunneling current by about two orders of magnitude for the worst case cell C12.

TABLE 2

| Cell | Vg | Vs | Vd | δV | Vfg | V1 | V2 | E1 | E2 |
|------|-----|----|----|----|------|-----|------|------|------|
| C22  | 12  | 0  | 6  | 1  |      |     |      |      |      |
|      |     |    |    | 4  |      |     |      |      |      |
| C21  | 12  | 0  | 0  | 1  | 7.2  | 4.9 | -7.2 | 2.4  | -7.2 |
|      |     |    |    | 4  | 5.2  | 6.8 | -5.2 | 3.4  | -5.2 |
| C12  | 1.5 | 0  | 6  | 1  | 0.9  | 0.6 | 5.1  | 0.3  | 5.1  |
|      |     |    |    | 4  | -1   | 2.5 | 7.0  | 1.3  | 7.0  |
| C11  | 1.5 | 0  | 0  | 1  | 0.3  | 1.2 | -0.3 | 0.6  | -0.3 |
|      |     |    |    | 4  | -1.6 | 3.1 | 1.6  | 1.6  | 1.6  |

Cells such as memory cell C11 which are not in the same row or column as selected memory cell C22 also have their control gate voltage Vg raised, but disturb caused by the increase in control gate voltage Vg is insignificant (orders of magnitude less than the drain disturb of cells in the selected column). For the example shown in Table 2, the drain disturb of memory cells such as memory cell C12 which are in the selected column drops to a level about equal to the drain disturb of memory cells such as memory cell C21 which are in the selected row. Accordingly, for the example of Table 2, drain disturb in selected row becomes the limiting disturbance.

The reduction in the tunneling current causing a drain disturb results in a substantial reduction in threshold voltage disturbance per write. Viewed in another way, the reduction in the tunneling current proportionally increases the maximum number of memory cells on a bit line (i.e. the number of word-lines and the size of an array) allowed when a limit on accumulated threshold voltage disturb must be maintained. Memory cell density in analog and multi-level memory can therefore be increased providing more storage without extensive overhead in integrated circuit area.

Applying a 1.5-volt bias voltage Vbias to word-lines could cause some of the memory cells to conduct. For example, if memory cell C12 is erased and has a threshold voltage of 1.5 volts or less, a 1.5-volt bias voltage would turn on a current flow through memory cell C12. An accumulation of such currents from memory cells in the selected column can easily overcome the capabilities of a charge pump which supplies the programming voltage to the selected bit line. This reduces the programming voltage and causes poor programming for the selected memory cell. To avoid currents through unselected cells during a write, bias voltage Vbias is only applied to a memory cell if voltage Vbias is less than the threshold voltage of the memory cell. A lower voltage (or ground potential) is applied to the unselected memory cells having threshold voltage below bias voltage Vbias.

One embodiment of the invention is a Flash memory for storing analog data. As is typical for Flash memory, after an erase of a memory array in the Flash memory, memory cells in the array have a distribution of threshold voltages; but the threshold voltages are all less than a cut-off voltage marking a boundary of an erased state for the memory cells. Writing an analog data value to a memory cell raises the threshold voltage of the memory cell to a level within a range that is in one-to-one correspondence with the possible analog data values storable in the memory cell. The range of programmed threshold voltages has a lower boundary which is above the cut-off voltage for the erased state so that all erased memory cells are written to by increasing their threshold voltages. For example, following an erase of a typical Flash memory array, the memory cells in the array have threshold voltages between about 0.5 volts and about 1.5 volts. The minimum threshold voltage corresponding to a data value can be selected to be 2.0 volts or higher so that the selected bias voltage Vbias is below the minimum threshold voltage corresponding to a data value. Accordingly, applying the bias voltage does not turn on any memory cells that store data. However, bias voltage Vbias can be above the threshold voltages of some or all memory cells in the erased state because unselected word-lines connected to memory cells in the erased state are grounded during programming rather than being at bias voltage Vbias. Reducing disturbance of erased memory cells is not critical because such disturbances do not change any data values.

Figure 2:
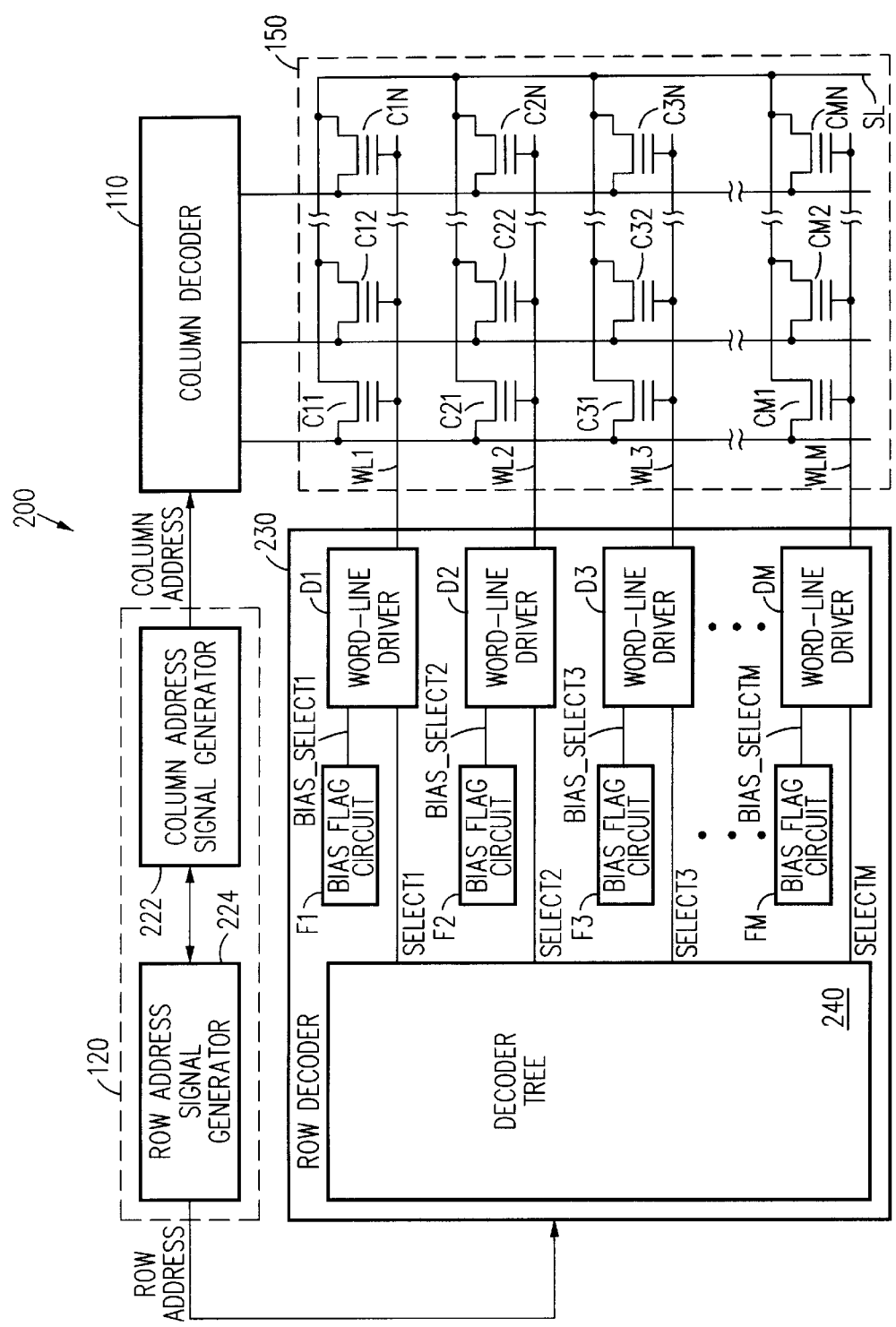
FIG. 2 illustrates a portion of a non-volatile semiconductor memory in accordance with an embodiment of the invention.

FIG. 2 illustrates part of a non-volatile semiconductor memory 200 in accordance with an embodiment of the invention. Memory 200 includes an array 150 of memory cells C11 to CMN as described above. Memory cells C11 to CMN are single transistor floating gate memory cells, but other embodiments of the invention may employ other types of memory cells. During programming of a selected memory cell, an address signal generator 120 generates a row address signal and a column address signal which identify the selected memory cell, and a column decoder 110 and a row decoder 230 generate programming voltages on a selected bit-line and a selected word-line corresponding to the selected memory cell.

Row decoder 230 includes a decoder tree 240, bias flag circuits F1 to FM, and word-line drivers D1 to DM. Bias flag circuits F1 to FM indicate which rows contain stored data and which rows do not. After each erase of memory array 150, all of bias flag circuits F1 to FM indicate none of rows contain data values. When writing a data value, decoder tree 240 asserts the one of select signals $\overline{\text{SELECT1}}$ to $\overline{\text{SELECTM}}$ which corresponds to the selected row, and the one of drivers D1 to DM to which the select signal is asserted applies a programming voltage to the selected word-line. After a word-line is selected, the bias flag circuit associated with the selected word line indicates that data has been written to the selected row so that the bias voltage Vbias is applied to the word-line if the word-line is unselected during a subsequent write. In one embodiment of the invention, each bias flag circuit F1 to FM acts as a volatile memory cell or latch which is set when the associated word-line WL1 to WLM is selected during a write. Flag circuits F1 to FM can be cleared when array 150 is erased or alternatively before each memory operation including reading from and writing to memory array 150.

In addition to programming voltage on the selected word-line, drivers D1 to DM also apply bias voltage Vbias to some unselected word-lines and ground other unselected word-lines. Whether particular ones of word-lines WL1 to WLM are grounded or at bias voltage Vbias when unselected depends on signal $\overline{\text{BIAS\_SELECT1}}$ to $\overline{\text{BIAS\_SELECTM}}$ from the associated bias flag circuits F1 to FM. If a bias flag circuit indicates that an unselected row contains stored data, the associated word-line driver applies bias voltage Vbias to the unselected word-line. If the flag circuit indicates that an unselected row contains no data, the associated word-line grounds the unselected word-line.

In one embodiment of the invention, memory 200 stores a series of samples representing a continuous signal such as an audio signal. Each sample is an analog value or a multi-level value which is written into one of memory cells C11 to CMN. When recording the continuous signal (i.e. writing the samples), address signal generator 120 selects where each sample is written and generates consecutive address signals so that a row of memory cells is filled with data values before writing samples to the next row begins. For example, samples can be written sequentially beginning with memory cell C11 which is in the first row and first column. When the first value is written, a row address signal generator 224 asserts a row address which causes decoder tree 240 to assert signal $\overline{\text{SELECT1}}$ and set bias flag circuit F1 to indicate row C11 . . . C1N contains data. Programming voltages are applied to the first (i.e. selected) word-line WL1; and while a data value is written to memory cell C11, all of the unselected word-lines WL2 to WLM are grounded because all of bias flag circuits F2 to FM were cleared following an erase.

The row address signal remains constant and the same select signal $\overline{\text{SELECT1}}$ remains asserted while a column address signal generator 222 sequentially increments the column address signal for writing data values in row C11 . . . C1N. The gate programming voltage is applied to first word-line WL1 while writing to the first row. After a data value is written to the last memory cell C1N in the first row, row address signal generator 224 increments the row address signal, and writing continues with memory cells in the second row C21 . . . C2N. When programming the second row, word-line driver D2 asserts the programming voltage to the selected second word-line WL2. Unselected word-lines WL3 to WLM are grounded when programming memory cells in row C21 . . . C2N, but driver D1 for the now unselected first row C11 . . . C1N applies bias voltage Vbias to word-line WL1 because associated bias flag circuit F1 asserts a signal indicating the first row contains data. None of the memory cells in the first row conduct because each memory cell has been programmed to a threshold voltage level above bias voltage Vbias. After the last memory cell C2N in row C21 . . . C2N is programmed, two unselected word-lines WL1 and WL2 are at bias voltage Vbias during programming. Programming continues in this fashion until the last row CM1 . . . CMN is programmed.

Circuitry which implements the programming process described for memory 200 of FIG. 2, can be implemented in a variety of ways. For example, bias flag circuits F1 to FM can be level triggered latches or edge triggered registers which are set when an associated word-line is selected. Bias flag circuits F1 to FM can alternatively be replaced with a shift register that shifts each time the row address signal changes. Alternatively, a non-volatile memory cell from each row in array 150 can be programmed to indicate whether the remainder of memory cells in a row are in an erased state. In yet another embodiment of the invention, bias flag circuits F1 to FM do not have memory capabilities but instead use the row address signal to directly determine whether rows 1 to M contain data. Rows having row addresses lower than a row selected for a write contain data if memory cells are sequentially programmed.

Figure 3:
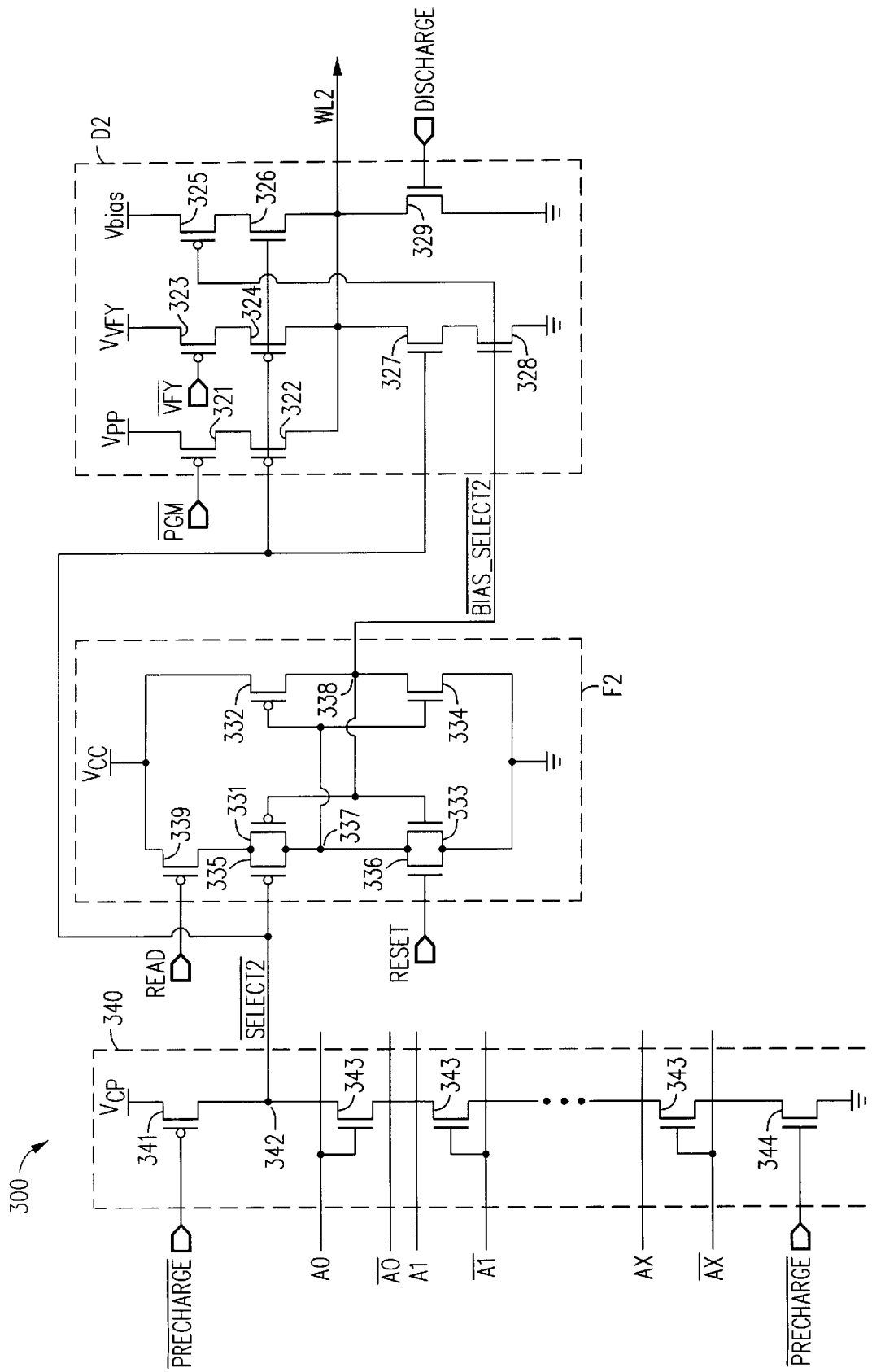
FIG. 3 shows a circuit diagram of row decoding circuitry in accordance with an embodiment of the invention.
Figure 4:
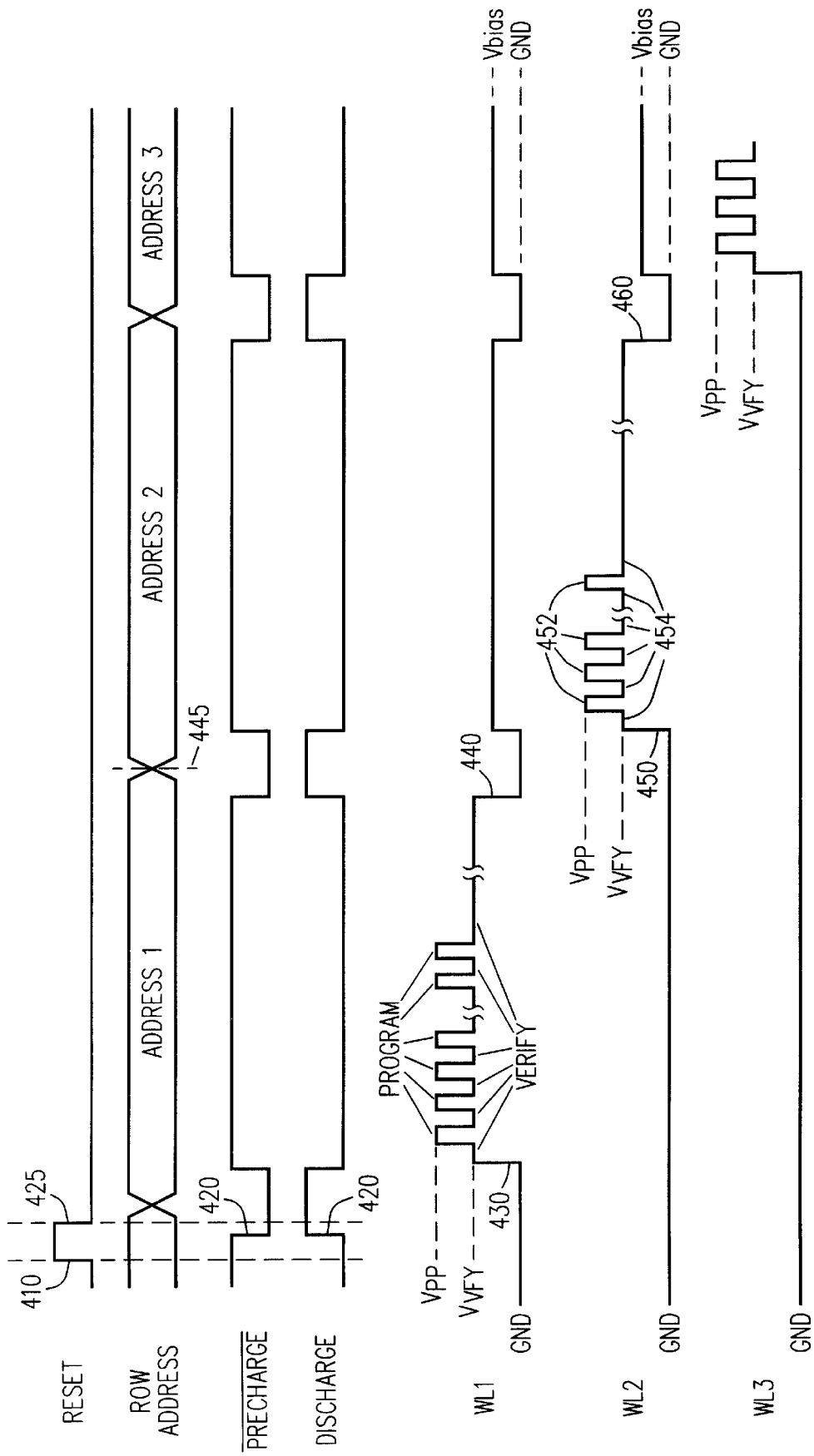
FIG. 4 shows timing diagrams for the embodiment of the invention shown in FIG. 3.

FIG. 3 shows row decoding circuitry 300 for programming a row of a non-volatile analog or multi-level memory cells connected to word-line WL2 of memory 200 (FIG. 2). Decoding circuitry 300 includes a decoder tree 340, a bias flag circuit F2, and a word-line driver D2 which are associated with word-line WL2. Decoding circuitry 300 for word-line WL2 is an example of similar decoding circuitry for each of word-lines WL1 to WLM. FIG. 4, which is described herein in conjunction with FIG. 3, shows timing diagrams for signals in decoding circuitry 300, and voltages on word-lines WL1 and WL3 which are adjacent to word-line WL2.

Bias flag circuit F2 contains a p-channel transistor 331 and a n-channel transistors 333 which are connected in series between ground and a supply voltage Vcc. Similar p-channel transistor 332 and n-channel transistor 334 are connected in series between voltage Vcc and ground. The gates of transistors 331 and 333 are connected to a node 338 between transistors 332 and 334, and the gates of transistors 332 and 334 are connected to a node 337 between transistors 331 and 333. In the manner of a standard SRAM cell, the voltages at nodes 337 and 338 are complementary and indicate a binary value stored in bias flag circuit F2. The voltage at node 338 is signal $\overline{\text{BIAS\_SELECT2}}$ and indicates whether word-line WL2 is selected for application of bias voltage Vbias. Bias flag circuit F2 also contains a transistor 336 which is connected in parallel with transistor 333. At the beginning of any operation such as writing or reading or after an erase, a signal RESET is asserted high to the gate of transistor 336 to ground node 337 and reset bias flag circuit F2 to a state where signal $\overline{\text{BIAS\_SELECT2}}$ is high, indicating word-line WL2 is not selected for application of bias voltage Vbias during programming. Similar circuits in decoding circuits for the other rows of the array are similarly reset by signal RESET. Once all bias flag circuits are reset, memory cells in the array can be selected and programmed if the memory cells were previously erased.

FIG. 4 shows a pulse beginning at time 410 before a write operation. A similar reset pulse is generated before a read operation. Resetting bias flag circuits F1 to FM before a read operation allows decoder tree 340 to select a row for a read but prevents the bias voltage from being applied to unselected word-lines WL1 to WLM during the read. During a read the maximum drain voltage can be kept less than 1.5 volts making the drain disturb orders of magnitude smaller than the programming disturb so that biasing unselected word-lines above the ground potential is not required. A transistor 339 between voltage Vcc and transistors 331 and 335 disconnects voltage Vcc from transistors 335 and 331 during a read. Accordingly, during a read, node 337 cannot be raised nor signal $\overline{\text{BIAS\_SELECT2}}$ asserted. During a write, transistor 339 applies voltage Vcc to transistors 335 and 331.

Decoder tree 340 generates a signal $\overline{\text{SELECT2}}$ which indicates whether word-line WL2 is the selected word-line. A signal $\overline{\text{PRECHARGE}}$ and transistors 341 and 344 control dynamic precharge for select signal $\overline{\text{SELECT2}}$. At a time 420, before a write and while reset signal RESET is still asserted, a signal $\overline{\text{PRECHARGE}}$ is asserted low which turns on a p-channel transistor 341, turns off an n-channel transistor 344, and charges a node 342 providing signal $\overline{\text{SELECT2}}$ to a voltage Vcp. A charge pump or other high voltage source (not shown) supplies voltage Vcp which is greater than or equal to programming voltage Vpp. Row address signals A0 to AX and $\overline{\text{A0}}$ to $\overline{\text{AX}}$ are applied to decoder tree 340 during precharge which charges a conducting string of transistors 343 connected to node 342. Signal DISCHARGE is simultaneously asserted high which causes a transistor 329 to discharge any voltage remaining on word-line WL2. When signal $\overline{\text{PRECHARGE}}$ goes high, signal $\overline{\text{SELECT2}}$ remains high unless transistors 343 all conduct and pull signal $\overline{\text{SELECT2}}$ low. A unique combination of row address signals A0 to AX and their complements $\overline{\text{A0}}$ to $\overline{\text{AX}}$ is connected to the gates of transistors 343 in each copy of decode circuitry 300 so that only one row is selected.

Signals $\overline{\text{SELECT2}}$ and $\overline{\text{BIAS\_SELECT2}}$ control driver D2 and determine the voltage applied to word-line WL2 during a write. Between times 430 and 440, data values are written to the first row, word-line WL2 is unselected, and all of the memory cells connected to word-line WL2 are in the erased state. Accordingly, signals $\overline{\text{SELECT2}}$ and $\overline{\text{BIAS\_SELECT2}}$ are both high. Signal being high shuts off p-channel transistors 322 and 324 in driver D2 and disables application of a programming voltage Vpp and a verify voltage Vvfy to word-line WL2. Signal $\overline{\text{SELECT2}}$ being high also turns on n-channel transistors 326 and 327. Signal $\overline{\text{BIAS\_SELECT2}}$ being high turns on an n-channel transistor 328 and turns off a p-channel transistor 325. Accordingly, word-line WL2 is grounded through transistors 327 and 328, and is not connected to bias voltage Vbias through transistors 325 and 326.

At time 440, signals $\overline{\text{PRECHARGE}}$ and DISCHARGE are again asserted in preparation for changing the row address signal to select word-line WL2. Signal $\overline{\text{SELECT2}}$ is applied to the gate of a p-channel transistor 335 which is connected in parallel with transistor 331. Transistor 335 is off which leaves signal $\overline{\text{BIAS\_SELECT2}}$ unchanged while signal $\overline{\text{SELECT2}}$ is high. At a time 450, when signal $\overline{\text{PRECHARGE}}$ is deasserted high, decoder tree 340 pulls signal $\overline{\text{SELECT2}}$ low, and transistor 335 pulls node 337 high causing signal BIAS_SELECT2 to fall. Signal $\overline{\text{BIAS\_SELECT2}}$ remains low. Signal $\overline{\text{BIAS\_SELECT2}}$ being low shuts off transistor 328 and disconnects word-line WL2 from ground. Signal $\overline{\text{SELECT2}}$ being low turns on p-channel transistors 322 and 324 which connects word-line WL2 to p-channel transistors 321 and 323 and enables application of voltages Vpp and Vvfy. N-channel transistor 326 is turned off disabling application of bias voltage Vbias.

FIG. 4 shows the voltage applied to word-line WL2 after time 450 when word-line WL2 is first selected for programming. The programming process illustrated in FIG. 4 uses a series of programming pulses 452 which are separated by a series of verify cycles 454. During each programming pulse 452, a signal $\overline{\text{PGM}}$ is asserted low which turns on a p-channel transistor 321 and drives word-line WL2 to programming voltage Vpp (typically about 12 volts). Programming voltage Vpp combined with a programming voltage (typically about 6 volts) applied to the bit-line of the selected memory cell and a grounding of a source-line cause CHE injection which increases the threshold voltage of the selected cell.

During verify cycles 454, a signal $\overline{\text{VFY}}$ is asserted low while signal $\overline{\text{PGM}}$ is high. This turns on a p-channel transistor 323 and shuts off p-channel transistor 321 so that word-line WL2 is driven to voltage Vvfy. Voltage Vvfy at a level indicating the data value being written and is therefore within the range of threshold voltages indicating data values (typically between 2 volts and 5 volts). During verify cycles, a sense circuit (not shown) determines whether the selected memory cell conducts while voltage Vvfy is applied to the control gate of the selected memory cell. The voltage on the selected bit-line during a verify cycle is decreased to about 1.5 volts. When the selected cell just begins to conduct during a verify cycle, the threshold voltage of the selected memory cell is about equal to voltage Vvfy and is at the desired threshold voltage to represent the analog or multi-level data value being written. Further programming pulses 452 are terminated, and the write to the selected memory cell is complete.

The row address signal remains constant while each cell in a selected row is programmed in the same manner described above. For each memory cell, voltage Vvfy changes according to the data value being written. Voltage Vpp can be constant or can vary according to the data value being written. At time 460, after the last memory cell in the second row is programmed, signal $\overline{\text{PRECHARGE}}$ is asserted low again, and the row address signal is changed to select the next row (i.e. word-line WL3). As a result, when signal $\overline{\text{SELECT2}}$ goes high, signal $\overline{\text{BIAS\_SELECT2}}$ remains low. Signal $\overline{\text{SELECT2}}$ being high disables application of the programming voltage to word-line WL2 and turns on transistor 326. Signal $\overline{\text{BIAS\_SELECT2}}$ being low shuts off n-channel transistor 328 to disconnect word-line WL2 from ground and turns on p-channel transistor 325 to connect word-line WL2 through transistors 325 and 326 to bias voltage Vbias. In a typical 5-volt Vcc application, voltage Vbias is targeted to be about 1.5 volts which is less than the minimum threshold voltage of memory cells storing data values.

Figure 5:
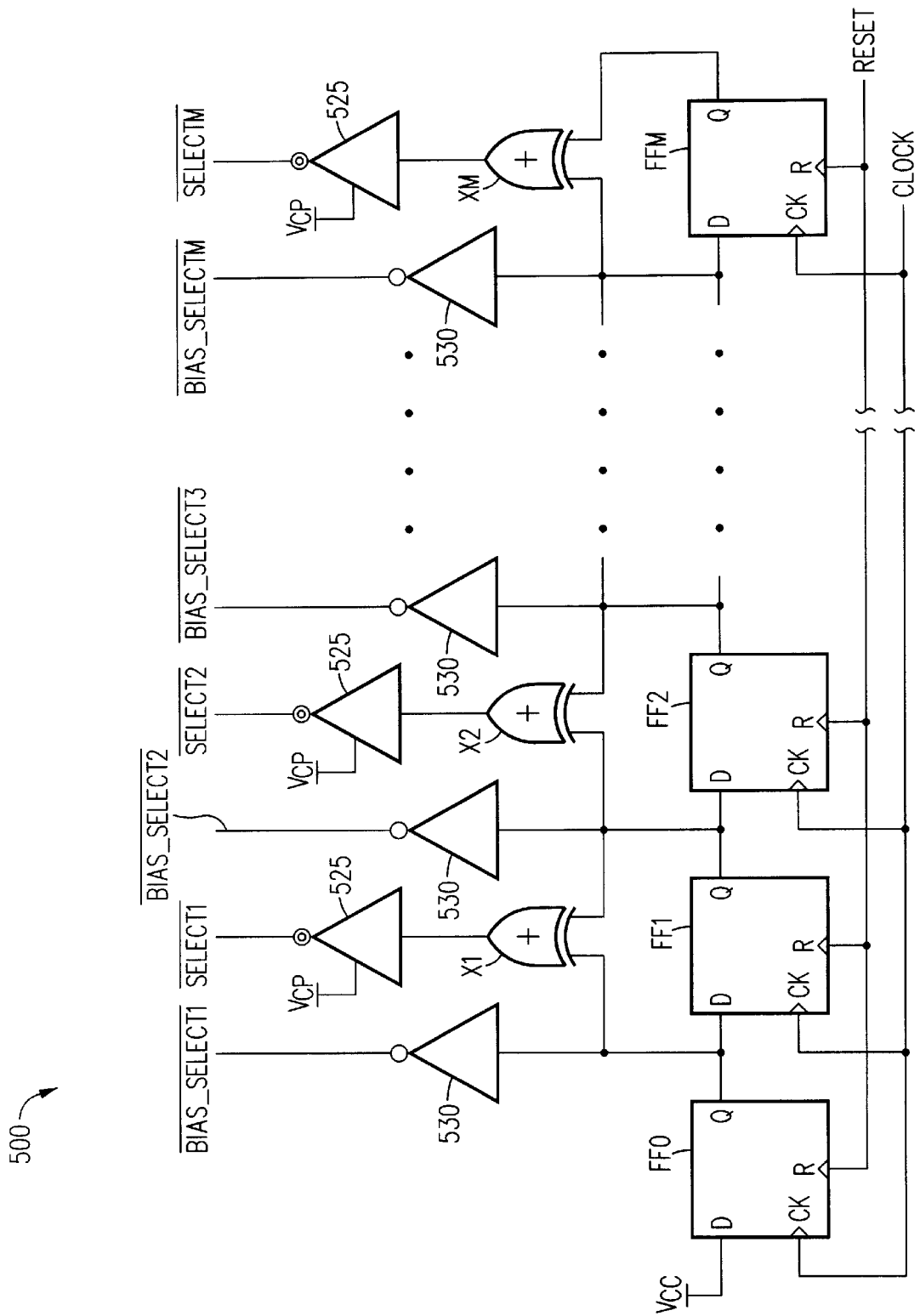
FIG. 5 shows a row decoding circuit for a non-volatile memory in accordance with another embodiment of the invention.

If memory 200 of FIG. 2 writes and reads data values sequentially, row address signal generator 224, decoder tree 240, and bias-flag circuits F1 to FM in memory 200 can be replaced by a row decoder 500 shown in FIG. 5. Row decoder 500 includes a set of flip-flops FF0 to FFM coupled in a series with a data output terminal Q of each preceding flip-flop FFI coupled to a data input D of a following flip-flop FF(I+1). The data input terminal of flip-flop FF0 is coupled to supply voltage Vcc. Flip-flops FF0 to FFM are all reset before each operation such as a write or a read of memory array 150. XOR gates X1 to XM have input terminals coupled to data output terminals of two consecutive flip-flops and generate signals which high voltage inverters 525 convert to signals $\overline{\text{SELECT1}}$ to $\overline{\text{SELECTM}}$. Initially, all data output signals from flip-flops FF0 to FFM are low, and inverters 525 set row select signals $\overline{\text{SELECT1}}$ to $\overline{\text{SELECTM}}$ to voltage Vcp to indicate no rows are selected.

When a write or read begins, a first pulse of a signal CLOCK causes the output of flip-flop FF0 to go high, the output signal from XOR gate X1 to go high, and signal $\overline{\text{SELECT1}}$ to go low selecting the first row. Clock signal CLOCK next clocks flip-flops FF0 to FFM when writing or reading of the first row is complete. At that point, the data output signals from flip-flops FF0 and FF1 are high causing output signal from XOR gate Xi to fall and signal $\overline{\text{SELECT1}}$ to go high. The output from XOR gate X2 goes high, and signal $\overline{\text{SELECT2}}$ falls to select the second row for reading or writing. Signal CLOCK clocks flip-flops FF0 to FFM in this same fashion after each row of memory array 150 is written or read, and each time flip-flops FF0 to FFM are clocked the next one of signals $\overline{\text{SELECT1}}$ to $\overline{\text{SELECTM}}$ selects a corresponding row in array 150. Accordingly, the rows of array 150 are sequentially selected.

Inverters 530 generate signals $\overline{\text{BIAS\_SELECT1}}$ to $\overline{\text{BIAS\_SELECTM}}$ from the data output signals of flip-flops FF0 to FF(M−1). Initially, all of the data output signals of flip-flops FF0 to FFM are low causing all of signals $\overline{\text{BIAS\_SELECT1}}$ to $\overline{\text{BIAS\_SELECTM}}$ to be high. Each time signal CLOCK clocks flip-flops FF0 to FFM another of the data output signals goes high and unselected rows are sequentially selected for application of word-line bias voltage Vbias. Inverters 530 are disabled during a read so that none of the unselected rows have a bias voltage applied during a read.

Although the invention has been described with reference to particular embodiments, the description is only an example of the invention's application and should not be taken as a limitation. Various adaptations and combinations of features of the embodiments disclosed are within the scope of the present invention as defined by the following claims.

We claim:

1. A method for writing a data value to a selected memory cell in an array of memory cells, comprising simultaneously:

applying a first voltage to a first word-line in the array, wherein memory cells coupled to the first word-line are in states indicating data values previously written to the memory cells;

applying a second voltage to a second word-line which is coupled to the selected memory cell, wherein a combination of the second voltage and voltages applied to a source and a drain of the selected memory cell changes the threshold voltage of the selected memory cell toward a state indicating the data value being written; and applying a third voltage to a third word-line in the array, wherein memory cells coupled to the third word-line are in an erased state.

2. The method of claim 1, wherein the third voltage is less than the first voltage and the first voltage is less than the second voltage.

3. The method of claim 2, wherein the third voltage is less than threshold voltages of memory cells in the erased state.

4. The method of claim 2, wherein the threshold voltages of memory cells in the erased state are less than the first voltage, and the threshold voltages of memory cells in states indicating data values are greater than the first voltage.

5. The method of claim 1, further comprising erasing the array to set the memory cells in the erased state, wherein at least some of memory cells in the erased state have a threshold voltage less than the first voltage.

6. The method of claim 5, further comprising writing data values to sequential addresses so that each memory cell in one row is written to before memory cells in an adjacent row are written to, wherein:

writing one of said data values to a memory cell raises the threshold voltage of the memory cell above the first voltage;

applying the first voltage comprises applying the first voltage to each word-line other than the second word-line, if every memory cell coupled to the word-line has been written; and applying the third voltage comprises applying the third voltage to each word-line other than the second word-line, if ever memory cell coupled to the word-line has not been written.

7. The method of claim 1, wherein the combination of the second voltage and the voltages applied to the source and the drain of the selected memory cell increases the threshold voltage of the selected memory cell.

8. The method of claim 1, wherein the data value being written is an analog value.

9. The method of claim 1, wherein the data value being written is from a set of discrete values.

10. A non-volatile memory, comprising:

an array of memory cells, the array including a set of word-lines, wherein each word-line is coupled to control gates of memory cells in a row associated with the word-line;

a row selection circuit which generates a signal identifying one of said rows containing one of said memory cells selected for a write operation; and a bias/driver circuit coupled to the row selection circuit and to the word-lines, the bias/driver circuit including means for identifying rows which contain data values, wherein the bias/dryer circuit applies a first voltage to one of said word-lines corresponding to the row identified by the signal from the row selection circuit, applies a second voltage to word-lines corresponding to rows identified as containing data values, and applies a third voltage to other word-lines.

11. The non-volatile memory of claim 10, further comprising a column decoder coupled to bit-lines in the array, the column decoder applying a programming voltage to a selected bit-line coupled to the memory cell selected for the write operation.

12. The non-volatile memory of claim 11, further comprising a sequential address generator coupled to the column decoder and the row selection circuit.

13. The non-volatile memory of claim 10, wherein the means for identifying rows which contain data values comprises a plurality of volatile memory devices which are coupled to the row selection circuit, wherein each memory device is associated with one of the word-lines in the array and a value in the memory device is set when the row selection circuit selects the word-line associated with the memory device.

14. The non-volatile memory of claim 10, wherein the means for identifying rows which contain data values comprises logic which determines whether a row of memory devices contains data from a row address signal applied to the row selection circuit.

15. The non-volatile memory of claim 10, wherein in a write operation, the bias/dryer circuit alternates between applying the first voltage and applying a fourth voltage to the word-line corresponding to the row identified by the signal from the row selection circuit.

16. The non-volatile memory of claim 15, wherein a first voltage is a programming voltage to change the threshold voltage of a selected memory cell corresponding to the row identified by the signal from the row selection circuit, and the fourth voltage is equal to a threshold voltage being written to the selected memory cell.

17. A row decoder for a non-volatile memory, comprising:

a plurality of memory devices; and a plurality of driver circuits, wherein each driver circuit is coupled to a corresponding one of the memory devices and to a corresponding word-line, and each driver circuit applies to the corresponding word-line a voltage which depends on a state of the corresponding memory devices and on whether the word-line is selected or unselected.

18. The row decoder of claim 17, wherein each memory device comprises a volatile memory device.

19. The row decoder of claim 17, wherein each memory device comprises a latch.

20. The row decoder of claim 17, wherein the plurality of memory devices constitute storage locations in a shift register.

21. The row decoder of claim 17, further comprising a decoder tree which generates a signal to identify which one of the word-lines is the selected word-line, wherein the decoder tree is coupled to the plurality of memory devices and sets the state of the memory device corresponding to the selected word-line.

22. The row decoder of claim 17, wherein the plurality of memory devices are connected in series with each memory device, except a last memory device in the series, having a data output terminal coupled to a data input terminal of a memory device following in the series;

a first logic circuit having input terminals coupled to the data input and output terminals of the memory devices and output terminals coupled to the plurality of driver circuits, wherein the first logic circuit generates signals which identify the selected word-line; and a second logic circuit having input terminals coupled to the data input and output terminals of the memory devices and output terminals coupled to the plurality of driver circuits, wherein the second logic circuit generates signals which identify whether a bias voltage is applied to respective word-lines when the word-lines are unselected during a write.

23. The row decoder of claim 22, wherein the first logic circuit comprises a plurality of exclusive OR gates, each exclusive OR gate having first and second input terminals coupled to respectively the data input terminal and the data output terminal of an associated one of the memory devices.

24. The row decoder of claim 17, wherein the state of each memory device corresponds to either data having already been written or data having been erased.

* * * * *